United States Patent [19]
Naokawa et al.

[11] Patent Number: 5,491,448
[45] Date of Patent: Feb. 13, 1996

[54] CLASS AB OUTPUT STAGE WITH IMPROVED FREQUENCY STABILITY

[75] Inventors: Toyojiro Naokawa, Saitama; Katsushige Fujii, Osaka, both of Japan

[73] Assignee: National Semiconductor Corporation, Santa Clara, Calif.

[21] Appl. No.: 282,866

[22] Filed: Jul. 29, 1994

[51] Int. Cl.$^6$ ................................................ H03F 3/30
[52] U.S. Cl. ................................... 330/264; 330/267
[58] Field of Search ........................... 330/255, 263, 330/264, 265, 267, 268

[56] References Cited

U.S. PATENT DOCUMENTS

| | | | |
|---|---|---|---|
| 4,419,631 | 12/1983 | Bertails et al. | 330/267 X |
| 4,570,128 | 2/1986 | Monticelli | 330/267 |
| 4,588,960 | 5/1986 | Salama et al. | 330/268 X |
| 4,800,339 | 1/1989 | Tanimoro et al. | 330/255 X |
| 5,140,280 | 8/1992 | Vyne et al. | 330/255 |

OTHER PUBLICATIONS

Robert L. Vyne, Thomas D. Petty, Rikki Koda, and David M. Susak; A Quad Low Voltage Rail-to-Rail Operational Amplifier; IEEE 1992 Bipolar Circuits and Technology Meeting; pp. 242–245.

Primary Examiner—James B. Mullins
Attorney, Agent, or Firm—Skjerven, Morrill, MacPherson, Franklin & Friel; Ken J. Koestner

[57] ABSTRACT

A class AB rail to rail output stage circuit, which includes two complementary output transistors connected in a push-pull manner, facilitates biasing of circuit transistors and improves frequency stability while supporting a wide rail to rail output voltage swing. A differential amplifier compares a biasing voltage applied to a first complementary output transistor to a reference voltage and the differential amplifier output signal is applied for biasing a second complementary output transistor.

22 Claims, 8 Drawing Sheets

5,491,448

CLASS AB OUTPUT STAGE WITH IMPROVED FREQUENCY STABILITY

BACKGROUND OF THE INVENTION

Field of the Invention

This invention relates to a class AB amplifier output stage and in particular to a method and structure for setting AB bias and maintaining frequency stability in a class AB amplifier rail to rail output stage.

Description of the Related Art

An output stage of an amplifier must satisfy many performance specifications, including delivering a specified signal voltage to a load while maintaining a low signal distortion. In many circuit applications, a wide voltage swing is specified so that maximum positive and negative output voltages as close as possible to positive and negative supply voltages is sought. The output stage should consume low quiescent power and not greatly limit the frequency response of the amplifier. Furthermore, the output stage should operate consistently, maintaining frequency stability over a range of operating conditions.

FIG. 1 illustrates a conventional class AB rail to rail output stage in which an output transistor Q4 is connected in series with a complementary output transistor Q5 in a push-pull fashion to drive output signals in response to input signals applied to an input drive transistor Q1. Biasing of the output stage is accomplished using a biasing transistor Q3 to drive the control terminal of output transistor Q4. A complementary biasing transistor Q2 is applied to drive the control terminal of complementary output transistor Q5. A constant voltage source $V_B$ maintains the voltage to the control terminal of biasing transistor Q3 at a predetermined level relative to a positive supply potential. Similarly, a constant voltage source $V_A$ maintains the voltage to the control terminal of complementary biasing transistor Q2 at a predetermined level relative to a negative supply potential.

Proper biasing of the output stage transistors is important for maintaining a predictable circuit behavior over varying operating conditions. One challenge in maintaining proper biasing arises because the push-pull circuit uses two types of transistors, one type to source an output current to a load and another complementary type to sink an output current from the load. When bipolar transistors are used for the output stage, the complementary types of transistors are pnp and npn transistors. In an output stage that utilizes MOS transistors, the complementary types of transistors are p-channel and n-channel transistors. Unfortunately, the complementary types of transistors often have greatly varying operating characteristics under different conditions, including temperature, frequency and fabrication conditions. These operating conditions result in variability in circuit biasing.

An output stage includes a feedback loop which furnishes frequency stability. In certain operating conditions, such as high frequency or high-current operating conditions, the feedback loop is severed and the frequency response of the circuit becomes unstable. For example, an input signal that causes the circuit shown in FIG. 1 to strongly drive transistor Q4 and thereby generate a forceful source current to a load $Z_{load}$ also greatly diminishes the driving current to transistor Q5. If transistor Q5 is driven too weakly or cut off, the feedback loop of the circuit is broken and the frequency response becomes unstable.

Summary of the Invention

In accordance with the invention, frequency stability is improved by maintaining the feedback loop of the circuit while operating in high-current and high frequency conditions.

The output stage of the present invention facilitates the determination of transistor biasing by reducing the number of transistors to be area scaled to achieve bias.

In accordance with the invention, an output stage which utilizes complementary types of output drive transistors in a push-pull fashion advantageously furnishes transistor biasing to each of the complementary types of output drive transistors in a mutually consistent manner by applying a voltage to each transistor that is controlled as a function of the biasing voltage applied to the other transistor.

These advantages are achieved in accordance with the invention by providing a class AB rail to rail output stage circuit having a signal input terminal, a signal output terminal and positive and negative supply terminals connectable to a source of operating power. The circuit includes an output transistor and a complementary output transistor, each having a flow path connected in series between the positive and negative supply terminals. The circuit also includes constant current source and a biasing transistor also connected in series between the positive and negative supply terminals. The biasing transistor is of a type complementary to the output transistor and is connected as a diode to generate a reference voltage. The circuit has a driving transistor that receives a signal at the signal input terminal and drives the complementary output transistor as a function of the input signal. The circuit includes a differential amplifier that has one input terminal which receives the signal driving the complementary output transistor, a differential input terminal which receives the reference voltage and an output terminal for driving the output transistor.

DESCRIPTION OF THE PREFERRED EMBODIMENTS

Figure 1:
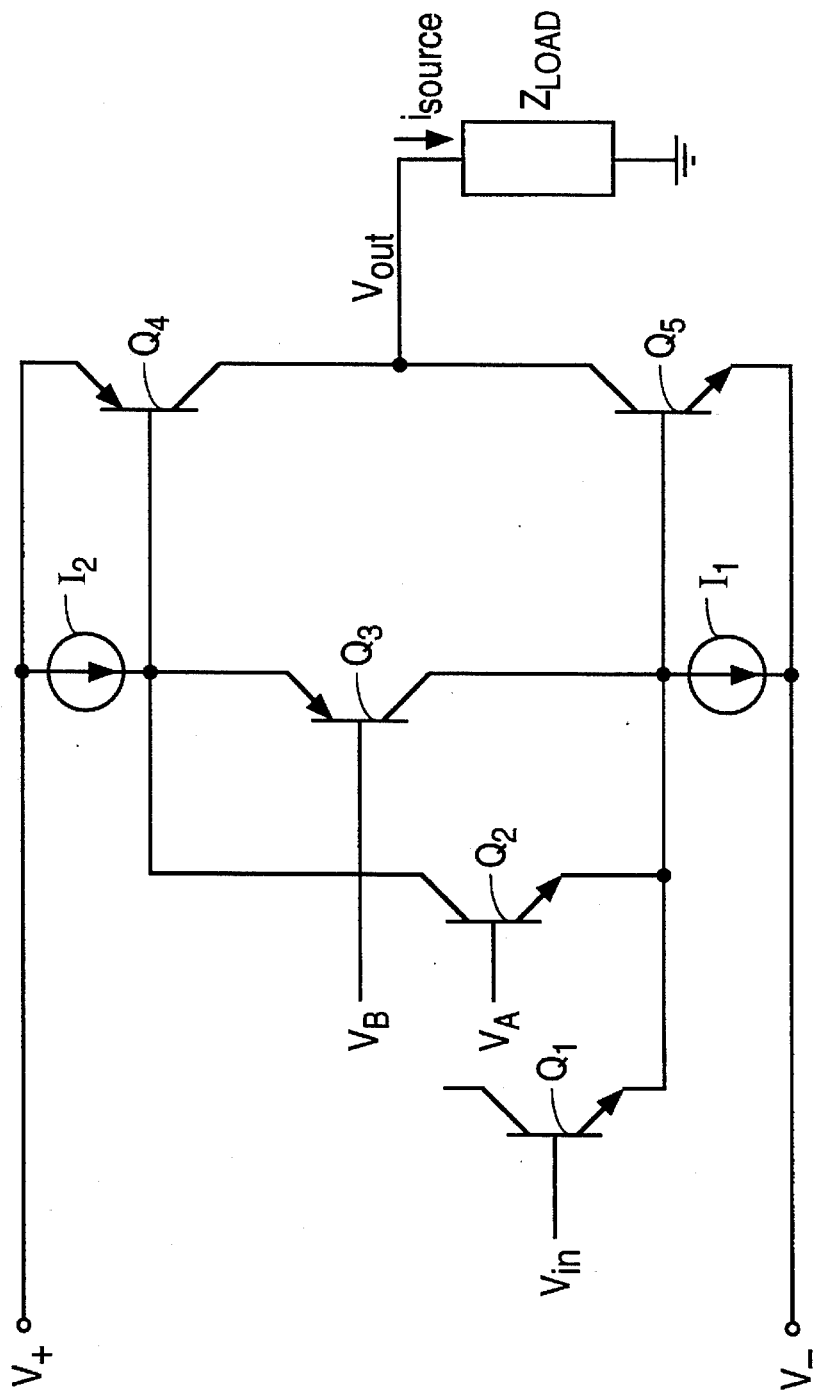
FIG. 1 illustrates a bipolar transistor schematic circuit diagram of a conventional class AB rail to rail output stage with a large voltage swing.
Figure 2:
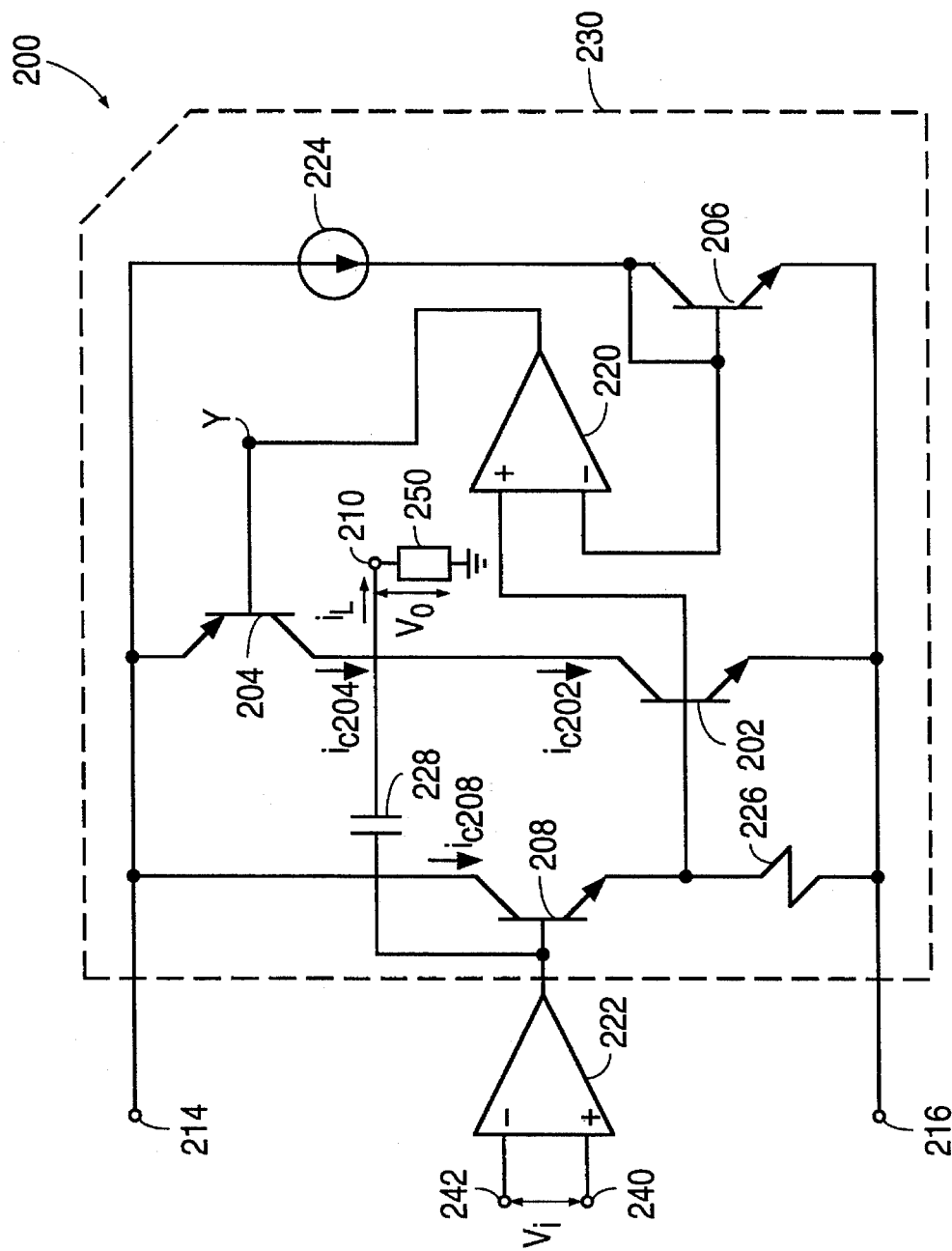
FIG. 2 is a simplified bipolar transistor schematic circuit diagram of an illustrative embodiment of a class AB output stage with a large voltage swing.

Referring to FIG. 2, an output stage 200 is a class AB rail to rail output stage which receives positive bias supply power at a $V_{pos}$ terminal 214 and receives negative bias supply power at a $V_{neg}$ terminal 216. The positive and negative bias supplies may have an equal magnitude or $V_{pos}$ terminal 214 and $V_{neg}$ terminal 216 may have different magnitudes. Output stage 200 generates an output signal at output terminal 210 to drive a load 250 in response to signals received at an inverting input terminal 242 and a noninverting input terminal 240.

Output transistor 204 and complementary output transistor 202 are output drive transistors of rail to rail output stage 200, which are connected in series between $V_{pos}$ terminal 214 and $V_{neg}$ terminal 216 with the emitter of output transistor 204 connected to $V_{pos}$ terminal 214 and the emitter of complementary output transistor 202 connected to $V_{neg}$ terminal 216 and the collectors of output transistor 204 and complementary output transistor 202 connected at the output terminal 210. The transistor sizes of complementary output transistor 202 and output transistor 204 are large relative to other transistors in the output stage 200 to sufficiently drive load 250. Complementary output transistor 202 and output transistor 204 are complementary in transistor type. In the FIG. 2 embodiment, complementary output transistor 202 is shown as a bipolar npn transistor and output transistor 204 is depicted as a bipolar pnp transistor.

A current source 224, a bias transconductance amplifier 220 and a bias transistor 206 furnish biasing of complementary output transistor 202 and output transistor 204. Current source 224 and bias transistor 206 are connected in series between $V_{pos}$ terminal 214 and $V_{neg}$ terminal 216 with bias transistor 206 having a collector connected to current source 224 and an emitter connected to $V_{neg}$ terminal 216. The collector and base of bias transistor 206 are interconnected so that bias transistor 206 is configured as a diode to supply a reference voltage to the minus input terminal of bias transconductance amplifier 220. The reference voltage is a voltage $V_{BE}$ more positive than the voltage on $V_{neg}$ terminal 216. Bias transconductance amplifier 220 includes a plus input terminal which is connected to the base of complementary output transistor 202, the minus input terminal which receives the reference voltage $-V_{neg}+V_{BE}$ and an output terminal which is connected to a node y and supplies a voltage to the base of output transistor 204. Bias transistor 206 is furnished to set a reference voltage to an input of bias transconductance amplifier 220. In this embodiment of rail to rail output stage 200, this reference voltage is the voltage difference of $V_{BE}$ from the potential on $V_{neg}$ terminal 216 and is used to set the class AB rail to rail output stage bias of complementary output transistor 202 and output transistor 204. Thus bias transistor 206 is a reference voltage generator which uses a constant current source 224 to establish the output current through complementary output transistor 202. Generally bias transistor 206 is the same type of transistor as complementary output transistor 202. Therefore, in this illustrative embodiment bias transistor 206 is depicted as a bipolar npn transistor. The emitter areas of bias transistor 206 and complementary output transistor 202 are scaled so that complementary output transistor 202 is the larger transistor of the two transistors to effectively drive load 250. Bias transconductance amplifier 220 is a differential amplifier which is connected in a closed-loop feedback network, depicted as a feedback loop 230. Feedback loop 230 includes transistors output transistor 204, complementary output transistor 202 and bias transistor 206, a resistor 226 and current source 224. Bias transconductance amplifier 220 adjusts the current applied to the base of bipolar output transistor 204 to equalize the voltages received at the plus and minus input terminals of bias transconductance amplifier 220. In an embodiment of a rail to rail output stage in which a bias transconductance amplifier drives a MOS output transistor, a bias transconductance amplifier adjusts the voltage applied to the gate of the MOS output transistor. Particularly, bias transconductance amplifier 220 controls the current driving the base of output transistor 204 so that the voltage applied to the base of complementary output transistor 202 is equal to $V_{BE}$ of bias transistor 206. In this manner, feedback loop 230 which includes bias transconductance amplifier 220, complementary output transistor 202, output transistor 204, bias transistor 206 and current source 224, advantageously provides for accurate and simple determination of AB biasing of rail to rail output stage 200. This biasing is accomplished by area scaling of the emitter of complementary output transistor 202 with respect to the emitter area of bias transistor 206. Output stage 200 also includes a frequency compensation capacitor 228, which is connected between the collector of output transistor 204 and the base of a drive transistor 208 to prevent feedback loop 230 of rail to rail output stage 200 from oscillating.

A drive transistor 208, shown as a bipolar npn transistor, furnishes driving current for complementary output transistor 202. Drive transistor 208 has a base, a collector connected to $V_{pos}$ terminal 214 and an emitter connected to the base of complementary output transistor 202 and connected to a resistor 226 which is, in turn, connected to $V_{neg}$ terminal 216. Resistor 226 sets the collector-emitter operating current of drive transistor 208 and serves as a current source or current path between $V_{pos}$ terminal 214 and $V_{neg}$ terminal 216. Bias transconductance amplifier 220 supplies driving current to the base of output transistor 204. If bias transconductance amplifier 220 does not have sufficient drive capability for output transistor 204, an additional drive transistor may be connected between the output terminal of bias transconductance amplifier 220 and the base of output transistor 204.

Input signals are applied to an input driver 222 of rail to rail output stage 200, which is shown in FIG. 2 as a differential stage input transconductance amplifier. Input driver 222 includes a minus input terminal which is inverting input terminal 242 to rail to rail output stage 200, a plus input terminal which is the noninverting input terminal 240 of rail to rail output stage 200 and an output terminal which is connected to the base of drive transistor 208 and to frequency compensation capacitor 228. Input driver 222 is a large amplifier to supply sufficient current drive to rail to rail output stage 200. Input driver 222 is shown as an operational amplifier to simplify the description of rail to rail output stage 200. Input driver 222 may take various other forms, such as another type of amplifier or amplifier stage including a single transistor or multiple transistor stage, for example.

When output voltage $V_o$ is zero, load current $i_L$ is also zero, although complementary output transistor 202 and output transistor 204 are biased so that a quiescent collector current of complementary output transistor 202 ($i_{C202}$) is equal to a quiescent collector current of output transistor 204 ($i_{C204}$). Output stage 200 is driven by an input voltage $V_i$, which is the differential potential between inverting input terminal 242 and noninverting input terminal 240 and has a quiescent dc value of $V_{BE1}$ for output voltage $V_o$ equal to zero volts. As input voltage $V_i$ is taken negative from the quiescent value, the collector current of drive transistor 208 ($i_{C208}$) increases and the potential at the base of complementary output transistor 202 rises, increasing collector current $i_{C202}$, sinking current from load 250 and decreasing output voltage $V_o$. Since the emitter of drive transistor 208 is also connected to the plus input of bias transconductance amplifier 220, the plus differential input voltage to bias transconductance amplifier 220 is increased. If the plus differential input voltage to bias transconductance amplifier 220 is increased above the reference voltage from the collector of bias transistor 206, the voltage generated by bias transconductance amplifier 220 and applied to the base of output transistor 204 rises, cutting off output transistor 204 and terminating collector current $i_{C204}$. Although output transistor 204 may be shut off, the feedback signal path of output stage 200 is preserved because output transistor 202 perpetually remains active.

Output stage 200 may fail to maintain a stable frequency response if complementary output transistor 202 is cut off. This is generally not a problem when output stage 200 is sinking current from load 250, since input voltage $V_i$ activates drive transistor 208 which, in turn, activates complementary output transistor 202. Therefore, complementary output transistor 202 is always active in a current sink mode. Note that output transistor 204 may be cut off in the sink mode, which does not deteriorate the frequency stability of output stage 200 since the feedback loop 230 that includes drive transistor 208 and complementary output transistor 202 is not deactivated.

As input voltage $V_i$ is taken positive from the quiescent voltage, collector current of drive transistor 208 decreases, the potential to the base of complementary output transistor 202 and to the plus differential input to bias transconductance amplifier 220 is decreased. However, the potential to the base of complementary output transistor 202 is not allowed to fall sufficiently to cut off complementary output transistor 202 and to thereby halt the flow of collector current $i_{C202}$. What prevents a cut off of complementary output transistor 202 is feedback loop 230. As the potential to the plus differential input to bias transconductance amplifier 220 is decreased, the voltage generated by bias transconductance amplifier 220 and applied to the base of output transistor 204 falls, activating output transistor 204 and the current flow of collector current $i_{C204}$. Nonetheless, the output voltage of bias transconductance amplifier 220 is not allowed to decrease enough to cut off complementary output transistor 202. When input voltage $V_i$ is taken positive, output transistor 204 is activated and causing flow of collector current $i_{C204}$ so that output stage 200 sources current to load 250. But while output stage 200 is sourcing current to load 250, feedback loop 230 assures activation of complementary output transistor 202 and flow of collector current $i_{C202}$. The potential to the base of complementary output transistor 202 is also kept sufficient to avoid deactivation of complementary output transistor 202 by frequency compensation capacitor 228 which forms a feedback loop in which a signal path from input driver 222, drive transistor 208, complementary output transistor 202, bias transconductance amplifier 220, output transistor 204 to output terminal 210 is fed back to output terminal of input driver 222 by frequency compensation capacitor 228.

Sustained activation of complementary output transistor 202, even when output transistor 204 fully active and output stage 200 is strongly sourcing current to load 250, is advantageous to maintain a stable frequency response. If complementary output transistor 202 were to become inactive, output stage 200 would not form a stable closed loop system. However, frequency stability is maintained by the sustained activation of complementary output transistor 202, through the operation of bias transconductance amplifier 220 in feedback loop 230, which keeps the frequency response stable by maintaining the closed loop operation when output stage 200 operates at high frequencies.

FIGS. 3, 4, 5 and 6 depict alternative embodiments of the series connection of complementary output transistor 202 and output transistor 204 to achieve rail to rail output stage drive performance with a minimum voltage loss. Any of these exemplary output stages may be substituted for the series connection of complementary output transistor 202 and output transistor 204 shown in FIG. 2. Note that certain of these examples use slightly different connecting circuitry, as is known in the art. For example voltage level shifters may be required for certain combinations of transistors. Each of these examples achieves a wide rail to rail output voltage swing and results in a minimum voltage loss, for example a voltage loss of $V_{CE(sat)}$ for a bipolar transistor.

Figure 3:
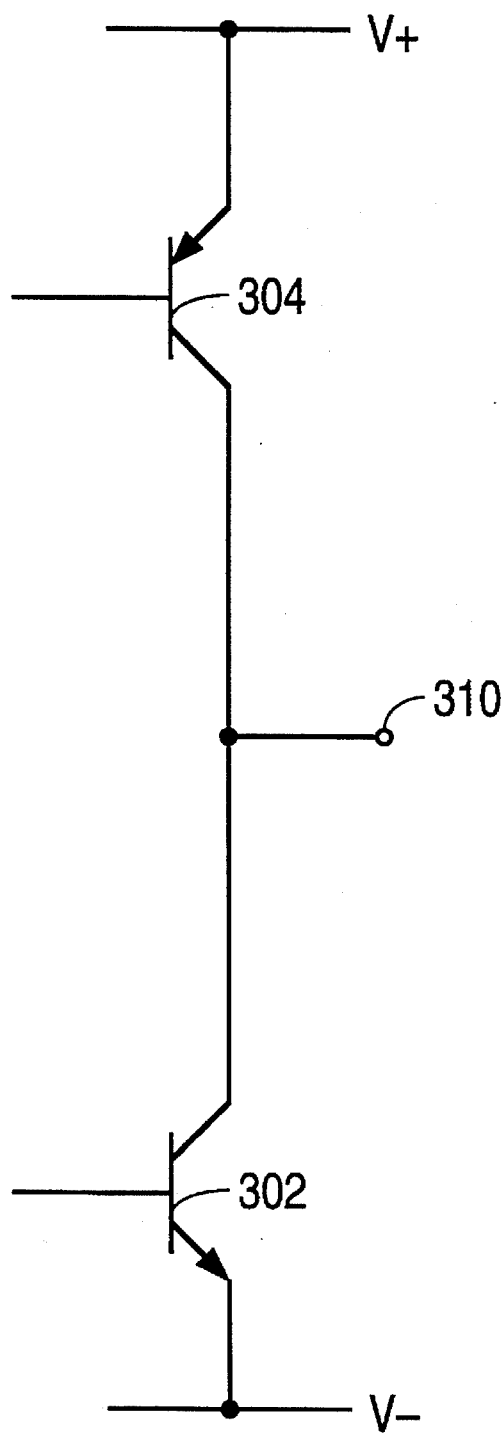
FIG. 3 is a schematic circuit diagram illustrating a first alternative embodiment of a series connection of output driver transistors.

Referring to FIG. 3 which illustrates a first alternative embodiment of a series connection of output driver transistors, output transistor 204 is depicted as a bipolar pnp transistor and complementary output transistor 202 is shown as a bipolar npn transistor. FIG. 3 depicts a pure bipolar rail to rail output stage 200, like that shown in the FIG. 2 output stage embodiment, with an npn transistor 302 on the bottom and a pnp transistor 304 on top and the collectors of each transistor connected at the output terminal 310.

Figure 4:
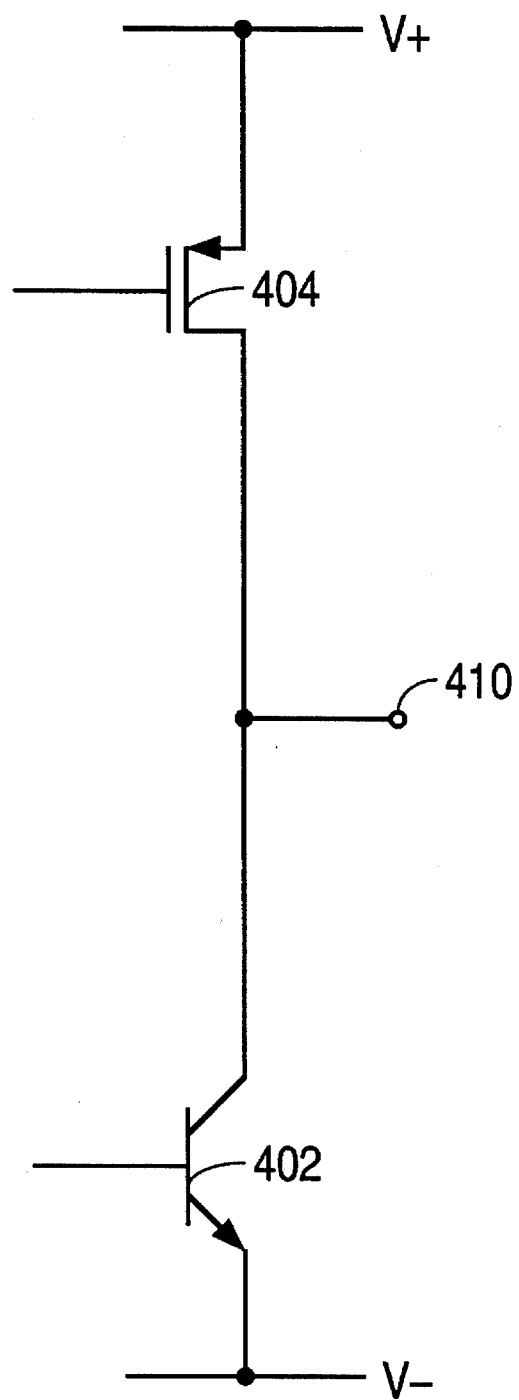
FIG. 4 is a schematic circuit diagram illustrating a second alternative embodiment of a series connection of output driver transistors.

FIG. 4 illustrates a second alternative embodiment with combined bipolar and MOS output drive transistors. A bipolar npn transistor 402 is shown on the bottom and a p-channel MOSFET transistor 404 is shown on the top with the collector of the npn transistor 402 and the drain of the p-channel MOSFET 404 connected at the output terminal 410. This example generally achieves a larger output sink current than the purely bipolar embodiment shown in FIG. 3.

Figure 5:
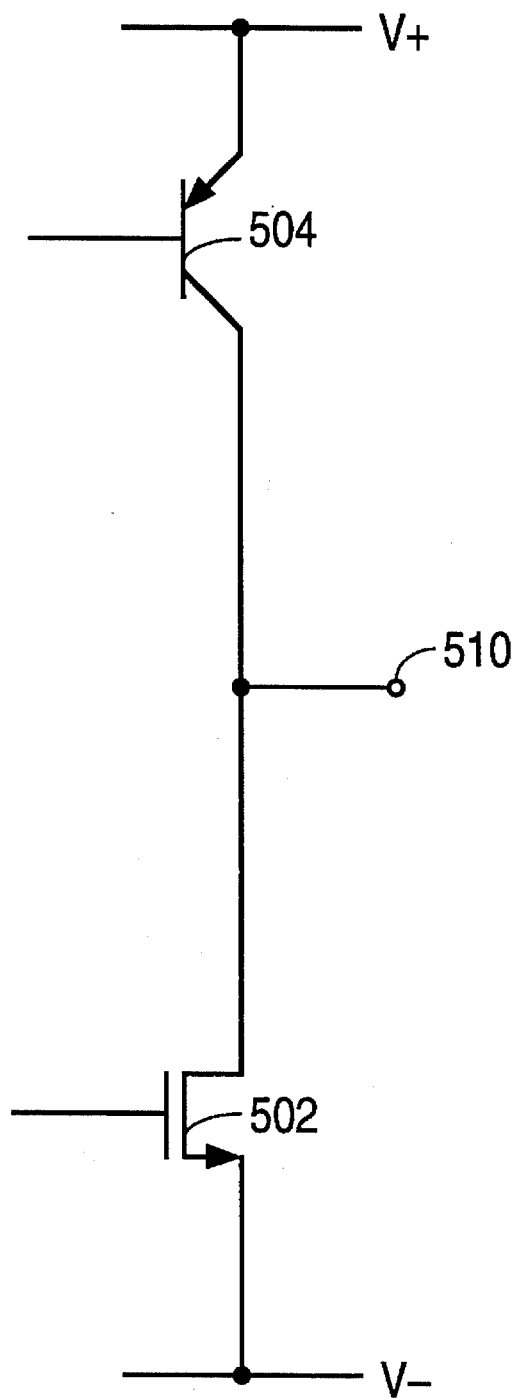
FIG. 5 is a schematic circuit diagram illustrating a third alternative embodiment of a series connection of output driver transistors.

FIG. 5 depicts a third alternative embodiment with combined bipolar and MOS output drive transistors. An n-channel MOSFET transistor 502 is shown on the bottom and a bipolar npn transistor 504 is shown on the top with the collector of the npn transistor 504 and the drain of the n-channel MOSFET 502 connected at the output terminal 510. In this embodiment, bias transistor 206 of FIG. 2 is replaced by an n-channel MOSFET transistor. In this embodiment, drive transistor 208 may be replaced by an n-channel MOSFET.

Figure 6:
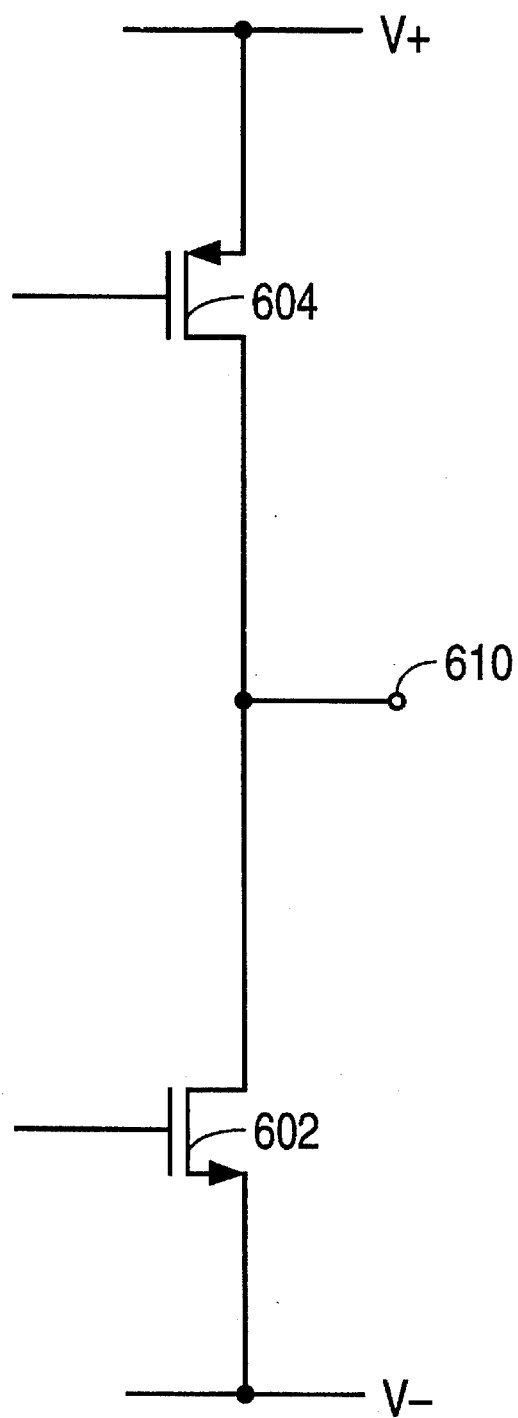
FIG. 6 is a schematic circuit diagram illustrating a fourth alternative embodiment of a series connection of output driver transistors.

FIG. 6 shows a fourth alternative embodiment with purely MOS output drive transistors. An n-channel MOSFET transistor 602 is shown on the bottom and a p-channel MOSFET transistor 604 is shown on the top with the drains the MOS transistors connected at an output terminal 610. In this embodiment, bias transistor 206 of FIG. 2 is replaced by an n-channel MOSFET transistor and drive transistor 208 may be replaced by an n-channel MOSFET.

Figure 7A:
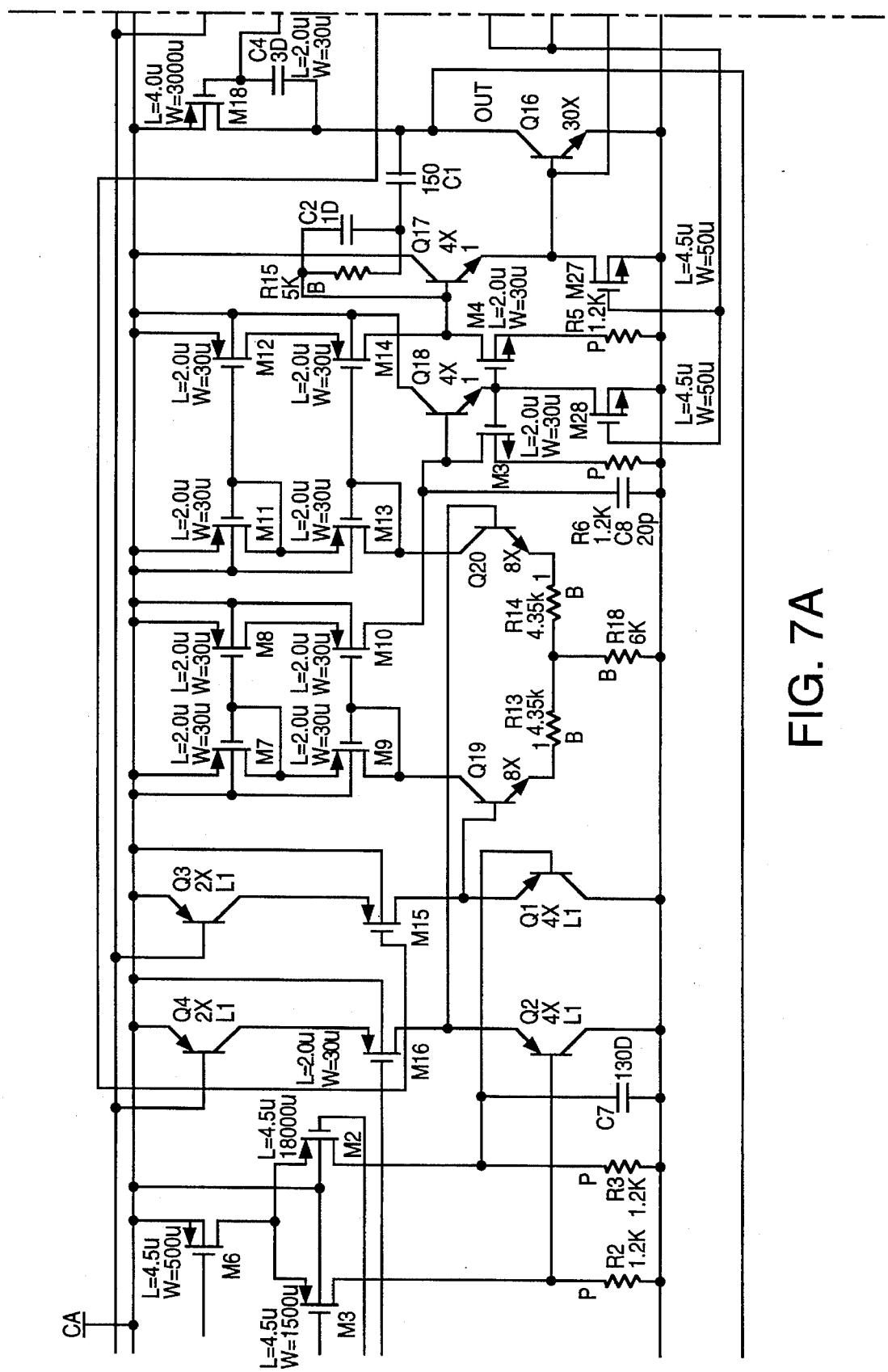
FIG. 7 is a schematic circuit diagram of an illustrative embodiment of a class AB rail to rail output stage with a large voltage swing which includes more detail than is shown in the FIG. 2 embodiment.
Figure 7B:
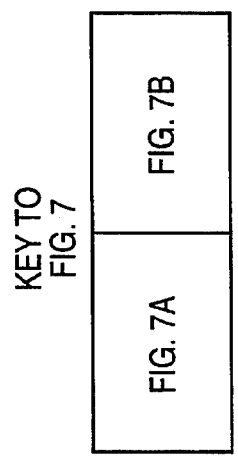
Figure 7B:
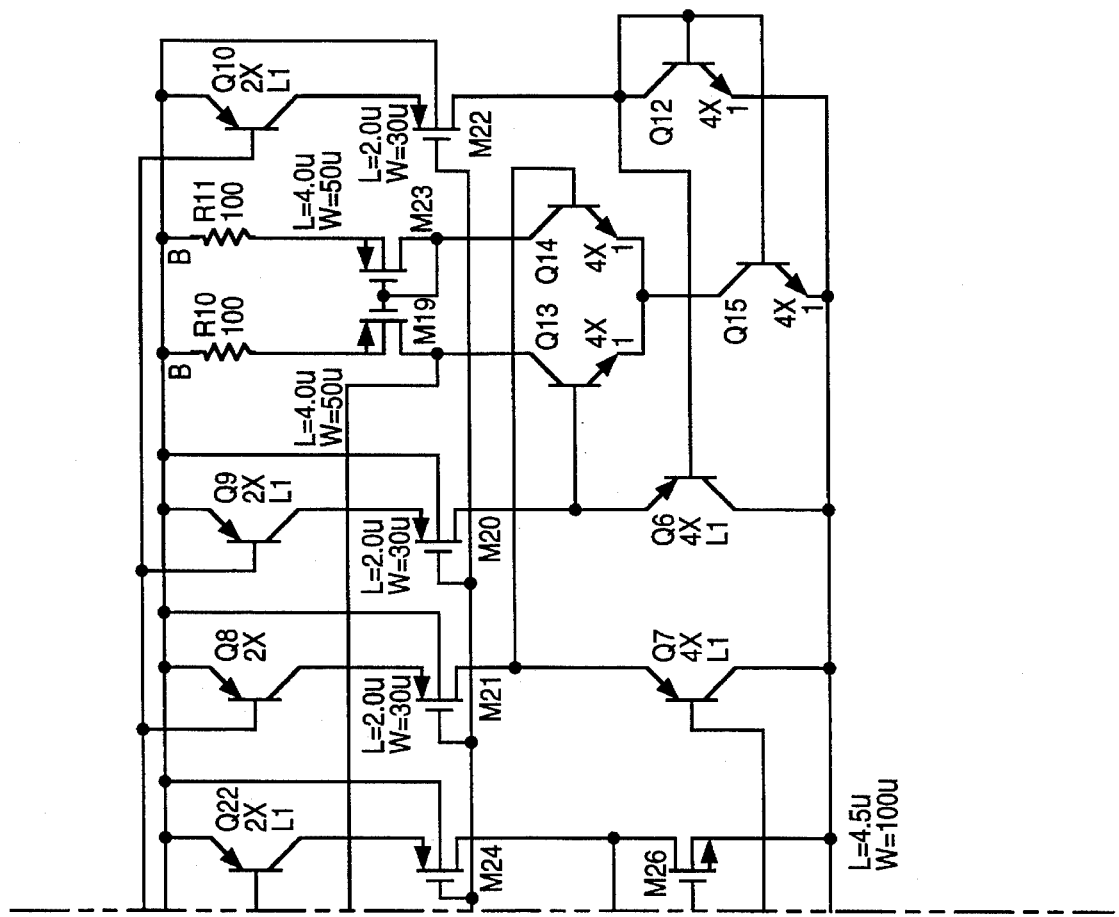

FIG. 7 illustrates a practical realization of a circuit which embodies the operative concept of the simplified circuit shown in FIG. 2. In the embodiment shown in FIG. 7, drive transistor 208, which is depicted as a bipolar npn transistor Q17, drives complementary output transistor 202, shown as bipolar npn transistor Q16, and applies an input voltage to bias transconductance amplifier 220. Bias transconductance amplifier 220 includes bipolar npn transistors Q13 and Q14 to respectively receive differential minus and plus input signals. Bias transconductance amplifier 220 also includes bipolar npn transistor Q15, p-channel FET M19 which is coupled in series to npn transistor Q13 and p-channel FET M23 which is coupled in series to npn transistor Q14. The output of bias transconductance amplifier 220, which is accessed from the drain of p-channel FET M19, is applied to the control terminal of output transistor 204. The embodiment of FIG. 7 employs p-channel FET M18 in the place of output transistor 204 of FIG. 2 so that the drain of p-channel FET M19 is connected to the gate of p-channel FET M18. It is apparent that the output stage of FIG. 7 utilizes an output drive transistor embodiment with combined bipolar and MOS transistors, as is shown in FIG. 4. The drain of p-channel FET M18 is connected to the collector of npn transistor Q16 to generate the output signal of output stage 200. Bias transistor 206 is furnished by bipolar npn transistor Q12 which has a base connected to the base of bipolar npn transistor Q15 of bias transconductance amplifier 220 to supply the minus differential input to bias transconductance amplifier 220. Current source 224 includes bipolar pnp transistor Q10 and bipolar npn transistor Q12 and the cascoded connection of p-channel FET M22. Bipolar pnp transistors Q6 and Q7 form a level shifter, which is used because bias transconductance amplifier 220 uses npn bipolar transistors to receive input signals and uses FET transistors to generate output signals. A level shift up about $V_{BE}$ supplies a proper voltage level. A current source for level shifter transistor Q6 includes a bipolar transistor Q9 and FET M20. A current source for level shifter transistor Q7 includes a bipolar transistor Q8 and FET M21.

The described embodiments are illustrative only and are not limiting. Various other embodiments and modifications and improvements not described herein may be within the spirit and scope of the present invention. The scope of the present invention is limited only by the claims which follow.

We claim:

1. A class AB rail to rail output stage circuit having a signal input terminal, a signal output terminal and having a first supply terminal and a second supply terminal, the supply terminals being connectable to a source of operating power, the circuit comprising:

an output transistor having a control terminal, a first current flow terminal coupled to the first supply terminal, and a second current flow terminal coupled to the signal output terminal;

a complementary output transistor, complementary in type to the output transistor, having a control terminal, a first current flow terminal coupled to the second supply terminal, and a second current flow terminal coupled to the signal output terminal;

a constant current source coupled to the first supply terminal;

a biasing transistor having a control terminal, a first current flow terminal coupled to the second supply terminal, and a second current flow terminal coupled to the constant current source and coupled to the biasing transistor control terminal, the biasing transistor having a size scaled to a size of the complementary output transistor so that a selected AB biasing is achieved;

a driver having an input terminal coupled to the signal input terminal and an output terminal coupled to the control terminal of the complementary output transistor;

a constant current path coupled between the driver output terminal and the second supply terminal; and a differential amplifier having a noninverting input terminal coupled to the output terminal of the driver, an inverting input terminal coupled to the control terminal of the biasing transistor and an output terminal coupled to the control terminal of the output transistor for applying a control current driving the output transistor so that a voltage applied to the control terminal of the complementary output transistor is equal to a base/emitter voltage of the biasing transistor.

2. A circuit as in claim 1 wherein the biasing transistor is a transistor of the same type as the complementary output transistor.

3. A circuit as in claim 1 wherein the driver is a transistor of the same type as the complementary output transistor.

4. A circuit as in claim 1 further comprising a frequency compensation capacitor coupling the signal input terminal to the signal output terminal.

5. A circuit as in claim 1 wherein the constant current path includes a resistor.

6. A circuit as in claim 1 wherein the differential amplifier is a transconductance amplifier.

7. A circuit as in claim 1 wherein:

the output transistor is a bipolar pnp transistor wherein the first current flow terminal is an emitter coupled to the first supply terminal, the second current flow terminal is a collector coupled to the signal output terminal and the control terminal is a base coupled to the output terminal of the differential amplifier;

the complementary output transistor is a bipolar npn transistor wherein the first current flow terminal is an emitter coupled to the second supply terminal, the second current flow terminal is a collector coupled to the signal output terminal and the control terminal is a base coupled to the output terminal of the driver; and the biasing transistor is a bipolar npn transistor wherein the first current flow terminal is an emitter coupled to the second supply terminal, the second current flow terminal is a collector and the control terminal is a base, the collector and base being intercoupled and coupled to the inverting input terminal of the differential amplifier.

8. A circuit as in claim 7 wherein the driver is a bipolar npn transistor having an output terminal which is an emitter coupled to the base of the complementary output transistor, having an input terminal which is a base coupled to the signal input terminal and having a collector coupled to the first supply terminal.

9. A circuit as in claim 1 wherein:

the output transistor is a MOSFET p-channel transistor wherein the first current flow terminal is a source coupled to the first supply terminal, the second current flow terminal is a drain coupled to the signal output terminal and the control terminal is a gate coupled to the output terminal of the differential amplifier;

the complementary output transistor is a bipolar npn transistor wherein the first current flow terminal is an emitter coupled to the second supply terminal, the second current flow terminal is a collector coupled to the signal output terminal and the control terminal is a base coupled to the output terminal of the driver; and the biasing transistor is a bipolar npn transistor wherein the first current flow terminal is an emitter coupled to the second supply terminal, the second current flow terminal is a collector and the control terminal is a base, the collector and base being intercoupled and coupled to the inverting input terminal of the differential amplifier.

10. A circuit as in claim 9 wherein the driver is a bipolar npn transistor having an output terminal which is an emitter coupled to the base of the complementary output transistor, having an input terminal which is a base coupled to the signal input terminal and having a collector coupled to the first supply terminal.

11. A class AB rail to rail output stage circuit having a signal input terminal, a signal output terminal and having a first supply terminal and a second supply terminal, the supply terminals being connectable to a source of operating power, the circuit comprising:

an output transistor having a control terminal, a first current flow terminal coupled to the first supply terminal, and a second current flow terminal coupled to the signal output terminal;

a complementary output transistor, complementary in type to the output transistor, having a control terminal, a first current flow terminal coupled to the second supply terminal, and a second current flow terminal coupled to the signal output terminal;

a constant current source coupled to the first supply terminal;

a biasing transistor having a control terminal, a first current flow terminal coupled to the second supply terminal, and a second current flow terminal coupled to the constant current source and coupled to the biasing transistor control terminal, the biasing transistor having a size scaled to a size of the complementary output transistor so that a selected AB biasing is achieved;

a driver having an input terminal coupled to the signal input terminal and an output terminal coupled to the control terminal of the complementary output transistor;

a constant current path coupled between the driver output terminal and the second supply terminal; and a differential amplifier having a noninverting input terminal coupled to the output terminal of the driver, an inverting input terminal coupled to the control terminal of the biasing transistor and an output terminal coupled to the control terminal of the output transistor for applying a control current driving the output transistor so that a voltage applied to the control terminal of the complementary output transistor is equal to a gate-source voltage of the biasing transistor; wherein:

the output transistor is a bipolar pnp transistor wherein the first current flow terminal is an emitter coupled to the first supply terminal, the second current flow terminal is a collector coupled to the signal output terminal and the control terminal is a base coupled to the output terminal of the differential amplifier;

the complementary output transistor is a MOSFET n-channel transistor wherein the first current flow terminal is a source coupled to the second supply terminal, the second current flow terminal is a drain coupled to the signal output terminal and the control terminal is a gate coupled to the output terminal of the driver; and the biasing transistor is a MOSFET n-channel transistor wherein the first current flow terminal is a source coupled to the second supply terminal, the second current flow terminal is a drain and the control terminal is a gate, the drain and the gate being intercoupled and coupled to the inverting input terminal of the differential amplifier.

12. A circuit as in claim 11 wherein the driver is a MOSFET n-channel transistor having an output terminal which is a source coupled to the gate of the complementary output transistor, having an input terminal which is a gate coupled to the signal input terminal and having a drain coupled to the first supply terminal.

13. A class AB rail to rail output stage circuit having a signal input terminal, a signal output terminal and having a first supply terminal and a second supply terminal, the supply terminals being connectable to a source of operating power, the circuit comprising:

an output transistor having a control terminal, a first current flow terminal coupled to the first supply terminal, and a second current flow terminal coupled to the signal output terminal;

a complementary output transistor, complementary in type to the output transistor, having a control terminal, a first current flow terminal coupled to the second supply terminal, and a second current flow terminal coupled to the signal output terminal;

a constant current source coupled to the first supply terminal;

a biasing transistor having a control terminal, a first current flow terminal coupled to the second supply terminal, and a second current flow terminal coupled to the constant current source and coupled to the biasing transistor control terminal, the biasing transistor having a size scaled to a size of the complementary output transistor so that a selected AB biasing is achieved;

a driver having an input terminal coupled to the signal input terminal and an output terminal coupled to the control terminal of the complementary output transistor;

a constant current path coupled between the driver output terminal and the second supply terminal; and a differential amplifier having a noninverting input terminal coupled to the output terminal of the driver, an inverting input terminal coupled to the control terminal of the biasing transistor and an output terminal coupled to the control terminal of the output transistor for applying a control current driving the output transistor so that a voltage applied to the control terminal of the complementary output transistor is equal to a gate-source voltage of the biasing transistor; wherein:

the output transistor is a MOSFET p-channel transistor wherein the first current flow terminal is a source coupled to the first supply terminal, the second current flow terminal is a drain coupled to the signal output terminal and the control terminal is a gate coupled to the output terminal of the differential amplifier;

the complementary output transistor is a MOSFET n-channel transistor wherein the first current flow terminal is a source coupled to the second supply terminal, the second current flow terminal is a drain coupled to the signal output terminal and the control terminal is a gate coupled to the output terminal of the driver; and the biasing transistor is a MOSFET n-channel transistor wherein the first current flow terminal is a source coupled to the second supply terminal, the second current flow terminal is a drain and the control terminal is a gate, the drain and the gate being intercoupled and coupled to the inverting input terminal of the differential amplifier.

14. A circuit as in claim 13 wherein the driver is a MOSFET n-channel transistor having an output terminal which is a source coupled to the gate of the complementary output transistor, having an input terminal which is a gate coupled to the signal input terminal and having a drain coupled to the first supply terminal.

15. A method of biasing a class AB output stage having an output transistor and a complementary output transistor coupled in series and having a biasing transistor, comprising the steps of:

driving the complementary output transistor with a voltage that varies as a function of an input signal to the output stage;

supplying a reference voltage generated by the biasing transistor having a size scaled to a size of the complementary output transistor so that a selected AB biasing is achieved;

determining a difference voltage between the voltage driving the complementary output transistor and the reference voltage;

driving the output transistor with the difference voltage; and applying a control current driving the output transistor so that a voltage applied to the control terminal of the complementary output transistor is equal to a base/emitter voltage of the biasing transistor.

16. A method as in claim 15 further comprising the step of feeding back a signal that varies as a function of the difference voltage to the voltage driving the complementary output transistor so that the complementary output transistor is always active.

17. A class AB rail to rail output stage circuit having a signal input terminal, a signal output terminal and having a positive supply terminal and a negative supply terminal, the supply terminals being connectable to a source of operating power, the circuit comprising:

an output transistor having a control terminal and two current flow terminals connecting a current flow path through the output transistor;

a complementary output transistor, complementary in type to the output transistor, having a control terminal and two current flow terminals connecting a current flow path through the complementary output transistor, the output transistor and the complementary output transistor being coupled in series at the signal output terminal so that the current flow paths of the output transistor and the complementary output transistor form a series current path between the positive supply terminal and the negative supply terminal;

a constant current source;

a biasing transistor, having a control terminal and two current flow terminals connecting a current flow path through the biasing transistor, the constant current source and the biasing transistor being coupled in series at a node so that the current flow paths of the constant current source and the biasing transistor form a series current path between the positive supply terminal and the negative supply terminal, the biasing transistor control terminal being coupled to the node, the biasing transistor having a size scaled to a size of the complementary output transistor so that a selected AB biasing is achieved;

a driver having an input terminal coupled to the signal input terminal and an output terminal coupled to the control terminal of the complementary output transistor;

a constant current path coupled between the driver output terminal and the negative supply terminal; and a differential amplifier having a noninverting input terminal coupled to the output terminal of the driver, an inverting input terminal coupled to the control terminal of the biasing transistor and an output terminal coupled to the control terminal of the output transistor for applying a control current driving the output transistor so that a voltage applied to the control terminal of the complementary output transistor is equal to a base/emitter voltage of the biasing transistor.

18. A circuit as in claim 17 wherein:

the output transistor is a bipolar pnp transistor wherein a first current flow terminal of the two current flow terminals is an emitter coupled to the first supply terminal, a second current flow terminal of the two current flow terminals is a collector coupled to the signal output terminal and the control terminal is a base coupled to the output terminal of the differential amplifier;

the complementary output transistor is a bipolar npn transistor wherein a first current flow terminal of the two current flow terminals is an emitter coupled to the second supply terminal, a second current flow terminal of the two current flow terminals is a collector coupled to the signal output terminal and the control terminal is a base coupled to the output terminal of the driver; and the biasing transistor is a bipolar npn transistor wherein a first current flow terminal of the two current flow terminals is an emitter coupled to the second supply terminal, a second current flow terminal of the two current flow terminals is a collector and the control terminal is a base, the collector and base being intercoupled and coupled to the inverting input terminal of the differential amplifier.

19. A circuit as in claim 17 wherein:

the output transistor is a MOSFET p-channel transistor wherein a first control terminal of the two current flow terminals is a source coupled to the first supply terminal, a second current flow terminal of the two current flow terminals is a drain coupled to the signal output terminal and the control terminal is a gate coupled to the output terminal of the differential amplifier;

the complementary output transistor is a bipolar npn transistor wherein a first current flow terminal of the two current flow terminals is an emitter coupled to the second supply terminal, a second current flow terminal of the two current flow terminals is a collector coupled to the signal output terminal and the control terminal is a base coupled to the output terminal of the driver; and the biasing transistor is a bipolar npn transistor wherein a first current flow terminal of the two current flow terminals is an emitter coupled to the second supply terminal, a second current flow terminal of the two current flow terminals is a collector and the control terminal is a base, the collector and base being intercoupled and coupled to the inverting input terminal of the differential amplifier.

20. A class AB rail to rail output stage circuit having a signal input terminal, a signal output terminal and having a positive supply terminal and a negative supply terminal, the supply terminals being connectable to a source of operating power, the circuit comprising:

an output transistor having a control terminal and two current flow terminals connecting a current flow path through the output transistor;

a complementary output transistor, complementary in type to the output transistor, having a control terminal and two current flow terminals connecting a current flow path through the complementary output transistor, the output transistor and the complementary output transistor being coupled in series at the signal output terminal so that the current flow paths of the output transistor and the complementary output transistor form a series current path between the positive supply terminal and the negative supply terminal;

a constant current source;

a biasing transistor, having a control terminal and two current flow terminals connecting a current flow path through the biasing transistor, the constant current source and the biasing transistor being coupled in series at a node so that the current flow paths of the constant current source and the biasing transistor form a series current path between the positive supply terminal and the negative supply terminal, the biasing transistor control terminal being coupled to the node, the biasing transistor having a size scaled to a size of the complementary output transistor so that a selected AB biasing is achieved;

a driver having an input terminal coupled to the signal input terminal and an output terminal coupled to the control terminal of the complementary output transistor;

a constant current path coupled between the driver output terminal and the negative supply terminal; and a differential amplifier having a noninverting input terminal coupled to the output terminal of the driver, an inverting input terminal coupled to the control terminal of the biasing transistor and an output terminal coupled to the control terminal of the output transistor for applying a control current driving the output transistor so that a voltage applied to the control terminal of the complementary output transistor is equal to a gate-source voltage of the biasing transistor; wherein:

the output transistor is a bipolar pnp transistor wherein a first current flow terminal of the two current flow terminals is an emitter coupled to the first supply terminal, a second current flow terminal of the two current flow terminals is a collector coupled to the signal output terminal and the control terminal is a base coupled to the output terminal of the differential amplifier;

the complementary output transistor is a MOSFET n-channel transistor wherein a first current flow terminal of the two current flow terminals is a source coupled to the second supply terminal, a second current flow terminal of the two current flow terminals is a drain coupled to the signal output terminal and the control terminal is a gate coupled to the output terminal of the driver; and the biasing transistor is a MOSFET n-channel transistor wherein a first current flow terminal of the two current flow terminals is a source coupled to the second supply terminal, a second current flow terminal of the two current flow terminals is a drain and the control terminal is a gate, the drain and the gate being intercoupled and coupled to the inverting input terminal of the differential amplifier.

21. A class AB rail to rail output stage circuit having a signal input terminal, a signal output terminal and having a positive supply terminal and a negative supply terminal, the supply terminals being connectable to a source of operating power, the circuit comprising:

an output transistor having a control terminal and two current flow terminals connecting a current flow path through the output transistor;

a complementary output transistor, complementary in type to the output transistor, having a control terminal and two current flow terminals connecting a current flow path through the complementary output transistor, the output transistor and the complementary output transistor being coupled in series at the signal output terminal so that the current flow paths of the output transistor and the complementary output transistor form a series current path between the positive supply terminal and the negative supply terminal;

a constant current source;

a biasing transistor, having a control terminal and two current flow terminals connecting a current flow path through the biasing transistor, the constant current source and the biasing transistor being coupled in series at a node so that the current flow paths of the constant current source and the biasing transistor form a series current path between the positive supply terminal and the negative supply terminal, the biasing transistor control terminal being coupled to the node, the biasing transistor having a size scaled to a size of the complementary output transistor so that a selected AB biasing is achieved;

a driver having an input terminal coupled to the signal input terminal and an output terminal coupled to the control terminal of the complementary output transistor;

a constant current path coupled between the driver output terminal and the negative supply terminal; and a differential amplifier having a noninverting input terminal coupled to the output terminal of the driver, an inverting input terminal coupled to the control terminal of the biasing transistor and an output terminal coupled to the control terminal of the output transistor for applying a control current driving the output transistor so that a voltage applied to the control terminal of the complementary output transistor is equal to a gate-source voltage of the biasing transistor; wherein:

the output transistor is a MOSFET p-channel transistor wherein a first control terminal of the two current flow terminals is a source coupled to the first supply terminal, a second current flow terminal of the two current flow terminals is a drain coupled to the signal output terminal and the control terminal is a gate coupled to the output terminal of the differential amplifier;

the complementary output transistor is a MOSFET n-channel transistor wherein a first current flow terminal of the two current flow terminals is a source coupled to the second supply terminal, a second current flow terminal of the two current flow terminals is a drain coupled to the signal output terminal and the control terminal is a gate coupled to the output terminal of the driver; and the biasing transistor is a MOSFET n-channel transistor wherein a first current flow terminal of the two current flow terminals is a source coupled to the second supply terminal, a second current flow terminal of the two current flow terminals is a drain and the control terminal is a gate, the drain and the gate being intercoupled and coupled to the inverting input terminal of the differential amplifier.

22. A class AB rail to rail output stage circuit having an input terminal, an output terminal and first and second supply terminals which are connectable to a source of operating power, the circuit comprising:

an output transistor having a control terminal and a current flow path;

a complementary output transistor having a control terminal and a current flow path coupled, between the first and second supply terminals, in series with the output transistor current flow path at the output terminal;

a diode-connected biasing transistor having a control terminal and a current flow path, the biasing transistor having a size scaled to a size of the complementary output transistor so that a selected AB biasing is achieved;

a constant current source coupled in series with the biasing transistor current flow path between the first and second supply terminals;

a differential amplifier having a noninverting input terminal, an inverting input terminal coupled to the biasing transistor control terminal and an output terminal coupled to the output transistor control terminal for applying a control current driving the output transistor so that a voltage applied to the control terminal of the complementary output transistor is equal to a base/emitter voltage of the biasing transistor; and a driver coupled to the input terminal to receive an input signal and coupled to the differential amplifier noninverting input terminal and the complementary output transistor control terminal to supply a drive signal as a function of the input signal.

* * * * *